United States Patent [19]
Saul

[11] Patent Number: 6,060,917
[45] Date of Patent: May 9, 2000

[54] FREQUENCY SYNTHESIZER

[75] Inventor: Peter H Saul, Towcester, United Kingdom

[73] Assignee: Mitel Semiconductor Limited, United Kingdom

[21] Appl. No.: 09/064,276

[22] Filed: Apr. 22, 1998

[30] Foreign Application Priority Data

May 1, 1997 [GB] United Kingdom .................... 9708943

[51] Int. Cl.[7] .................................................. H03B 21/00
[52] U.S. Cl. .......................... 327/107; 327/106; 327/105; 327/113; 708/271
[58] Field of Search .................................... 327/107, 105, 327/106, 141, 116, 357, 355; 708/271, 276

[56] References Cited

U.S. PATENT DOCUMENTS

| | | | |
|---|---|---|---|
| 4,454,486 | 6/1984 | Hassun et al. | 327/105 |
| 5,077,546 | 12/1991 | Carfi et al. | 327/119 |
| 5,304,938 | 4/1994 | Gregory et al. | 327/115 |
| 5,521,533 | 5/1996 | Swanke | 327/107 |
| 5,661,424 | 8/1997 | Tang | 327/105 |

OTHER PUBLICATIONS

Kishner, L. J., et al., "An 800–MHZX Monolithic Gaas HBT Serrodyne Modulator", IEEE Journal of Solid–State Circuits, vol. 30, No. 10, Oct. 1, 1995, pp. 1041–1050.

Nicholas, H. T., et al., "An Analysis of the Output Spectrum of Direct Digital Frequency Synthesizers in the Presence of Phase–Accumulator Truncation", Proceedings of the 41st Annual Frequency Symposium, 1987, pp. 495–502, Philadelphia.

*Primary Examiner*—Dinh Le
*Attorney, Agent, or Firm*—Kirschstein, et al.

[57] ABSTRACT

A frequency synthesizer comprises a direct digital frequency synthesizer (DDFS), which provides in-phase and quadrature sinewave signals at a preset frequency from digital analogue converters respectively, and a balanced mixer. The balanced mixer provides an output signal having a carrier frequency twice that provided by DDFS and reduced levels of spurious signals. A signal having a desired frequency is generated by controlling the DDFS to generate sinewave output signals at half the desired frequency. The reduced levels of spurious signals obtained by the arrangement allows improved signals for use in, for example, local oscillator applications.

5 Claims, 4 Drawing Sheets

FREQUENCY SYNTHESIZER

BACKGROUND OF THE INVENTION

The present invention relates to a frequency synthesizer and more particularly to a frequency synthesizer utilizing a direct digital frequency synthesizer.

Direct Digital Synthesis (DDS) is a well established circuit technique used in frequency synthesizers in applications where wide frequency ranges or very fast frequency hopping, or both, are required. One such synthesizer using this technique is the SP2002 400 MHz Direct Digital Frequency Synthesizer (DDFS) manufactured by GEC Plessey Semiconductors. This synthesizer chip is able to produce square, triangular and sinewave in phase and quadrature output signals at a frequency dependent on an applied clock frequency and an applied binary word. However, the levels of spurious signals on the outputs of such frequency synthesizers can be too high for use as, for example, the local oscillator in a radio receiver to be practical.

The unwanted spurious signals, or spurs, occur at amplitude and phase related terms, which are impossible to resolve on a conventional spectrum analyzer display though they can be considered as vectors. In this way, phase related spurs are orthogonal to the carrier whilst amplitude related spurs are in-phase or anti-phase with the carrier. The magnitude, number and position of the spurs in the output spectrum is related to the ROM look up table size, the non-linearities of the DACs, the amount of phase accumulator truncation and the frequency select commands of a DDFS. A discussion of these effects, along with a proposed modification to partially overcome them, is found in a paper by H. T. Nicholas and H. Samueli entitled "An Analysis of the Output Spectrum of Direct Digital Frequency Synthesisers in the Presence of Phase-Accumulator Truncation" at pp 495–502 of the published Proceedings of the 41st IEEE Annual Frequency Control Symposium.

Several other techniques exist for removing these spurious signals though each compromises the properties of the DDFS. The main applications of these DDFSs have therefore been limited to those where the spurious signals are acceptable, or where filtering by, for example, phase-locked loop techniques is possible.

SUMMARY OF THE INVENTION

The present invention was made as a result of exploration by the inventor into the mathematics of a DDFS and the output signals provided thereby. Considering the case where a single pair of spurious signals are present, the in phase and quadrature signals can be represented mathematically as U and V respectively:

$$U = A_o \cos(2\pi F_o t) + A_1 \sin(2\pi t (F_o + F_1)) + A_1 \sin(2\pi t (F_o - F_1))$$

$$V = A_o \sin(2\pi F_o t) + A_1 \cos(2\pi t (F_o + F_1)) + A_1 \cos(2\pi t (F_o - F_1))$$

where:

$A_o$ is the carrier amplitude, $A_1$ is the spurious amplitude, $F_o$ is the carrier frequency, and $F_1$ is the offset of the spurious pair from the carrier.

Though there will in reality be more sidebands in the in phase and quadrature signals, the analysis of a single pair is adequate for explanation of the present invention.

Multiplication of these terms gives:

$$U.V = \tfrac{1}{2} A_o^2 \sin(4\pi F_o t) + 2 A_o A_1 \cos(2\pi F_1 t) + A_1^2 \text{ terms}$$

The largest term of the result is at $2 F_o$; i.e. the carrier frequency has been doubled by multiplying the in phase and quadrature signals together. The terms with coefficient $A_1^2$ are small enough to neglect if the DACs are above, say, 6 bits in size. For the 8-bit DACs of the SP2002 chip, the $A_1^2$ spurs are 96 dB down. The terms which were at offsets of $\pm F_1$ have been phased out at the double frequency, $2F_o$.

In accordance with the present invention, there is provided a frequency synthesizer for generating a signal at a desired frequency comprising a direct digital frequency synthesizer operable to provide in phase and quadrature output signals at half said desired frequency; and a balanced mixer arranged to mix said in phase and quadrature signals to provide said desired frequency signal.

Use of a frequency synthesizer in accordance with the present invention provides a signal having lower levels of spurious signals, in relation to the carrier frequency signal level, than the signals provided by the direct digital frequency synthesizer utilized therein.

Preferably the frequency synthesizer has the balanced mixer and the direct digital frequency synthesizer fabricated as a single integrated circuit. In this way, mass production can be achieved at a lower cost than is possible with discrete components.

Preferably, the direct digital frequency synthesizer is operable to provide sinewave in phase and quadrature output signals, thereby providing a sinewave signal at said desired frequency from the balanced mixer. This preferred feature makes the frequency synthesizer particularly suitable for local oscillator and other similar applications.

BRIEF DESCRIPTION OF THE DRAWINGS

Embodiments will now be described, by way of example only, with reference to the accompanying drawings, of which.

DETAILED DESCRIPTION OF THE PREFERRED EMBODIMENTS

Figure 1:
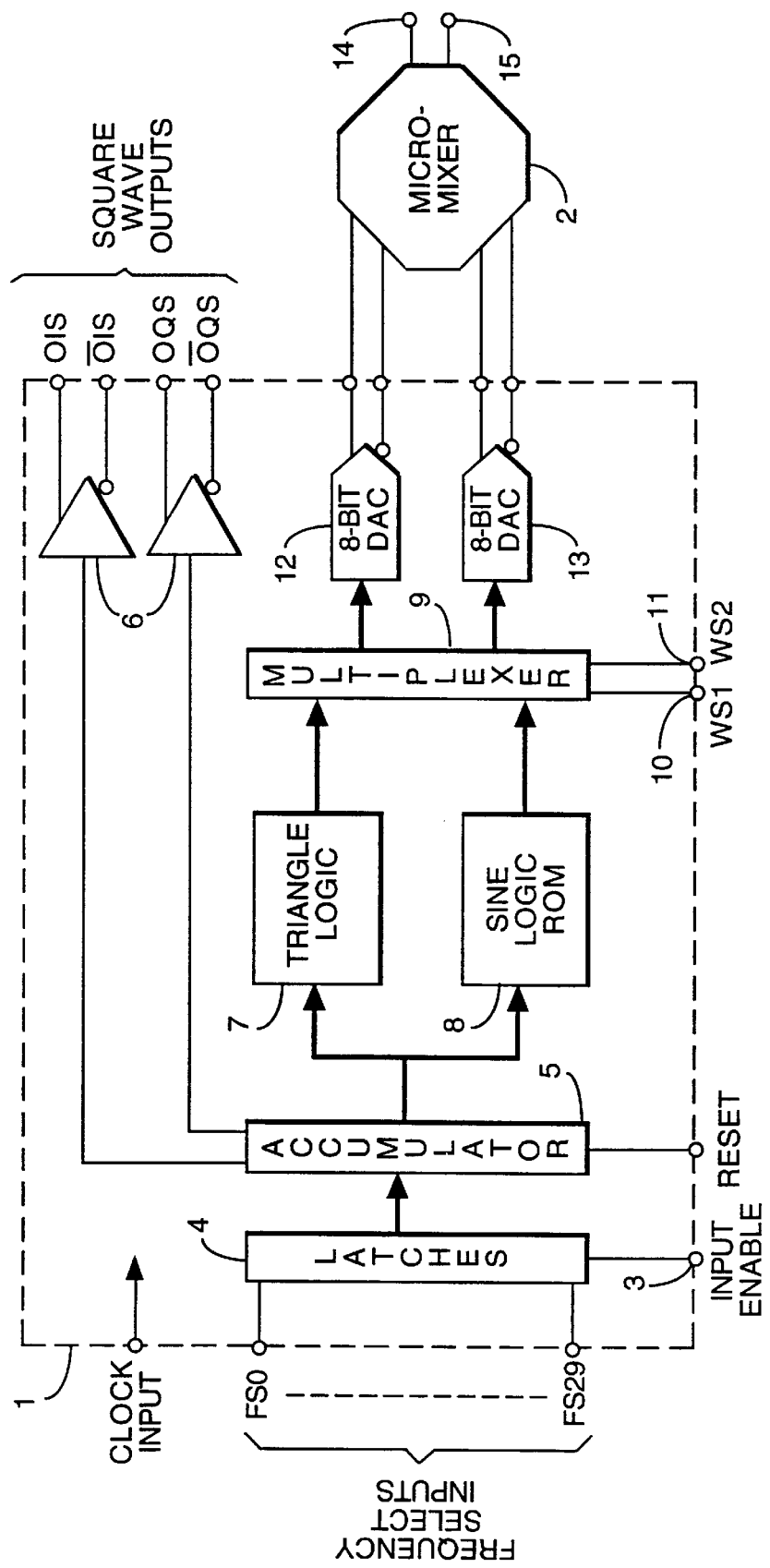
FIG. 1 shows, in block diagram form, a first embodiment of a frequency synthesizer in accordance with the present invention.

Referring first to FIG. 1, a frequency synthesizer in accordance with the present invention is shown comprising an SP2002 DDFS labelled generally at 1, and a micromixer circuit 2.

The DDFS 1 comprises 30 frequency select inputs FS0–FS29 which, along with an input enable electrode 3, are connected to a number of solid state latches, indicated generally at 4. These latches 4 feed their outputs into the inputs of an accumulator 5 which generates pulses at the frequency dependent on the clock frequency and the selection made by way of frequency select inputs FS0–FS29. In phase and quadrature square wave output signals can be generated by output devices 6 with reference to the pulses from the accumulator 5. Alternatively, like pulses are used by either sine logic ROM 8 or triangle logic device 9, dependent on the signals applied to a multiplexer 9 by way of terminals 10 and 11, to provide analogue in phase and quadrature signals at respective outputs of DACs 12 and 13.

To generate a 200 MHz sinewave output signal at terminals 14 and 15, DDFS 1 is applied with suitable signals at frequency select inputs FS0 to FS29 and terminals 10 and 11 to cause DAC 12 to generate a 100 MHz in phase sinewave signal and DAC 13 to generate its quadrature signal. The micromixer circuit 2, operating in a linear region, provides at output terminals 14 and 15 a signal having spurious signal levels lower, in relation to the carrier frequency signal level, than the spurious signal levels provided by each of DACs 12 and 13.

Figure 2:
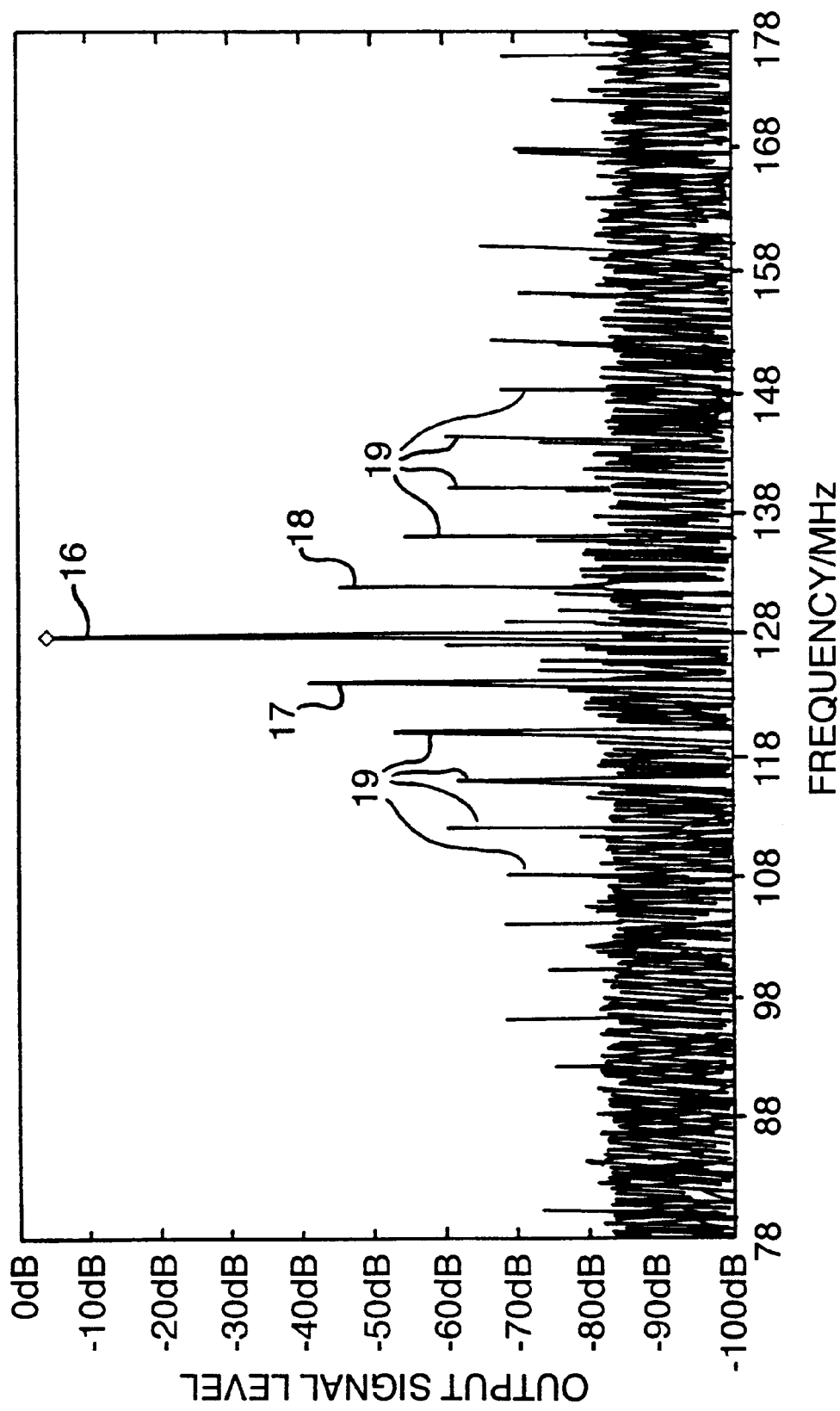
FIG. 2 shows the spectrum of an output signal of an SP2002 direct digital frequency synthesizer.

The SP2002 DDFS chip when controlled to provide a 127.5 MHz sinewave output signal from a 1024 MHz clock, has in phase and quadrature output signals each having the spectrum shown in FIG. 2. This output frequency was chosen, as being near to an integer fraction of the clock frequency, to provide particularly strong spurs in the output signal of the DDFS 1. As can be seen, the spectrum comprises a strong carrier frequency signal 16 at 127.5 MHz and a range of spurious signals 17, 18, 19 at approximately 4 MHz spacings on each side thereof. The largest spur 17 is at −35 dBc. The corresponding spur 18, on the other side of the carrier frequency, is slightly smaller due to the complex mix of phase terms and amplitude terms in the signal.

Figure 3:
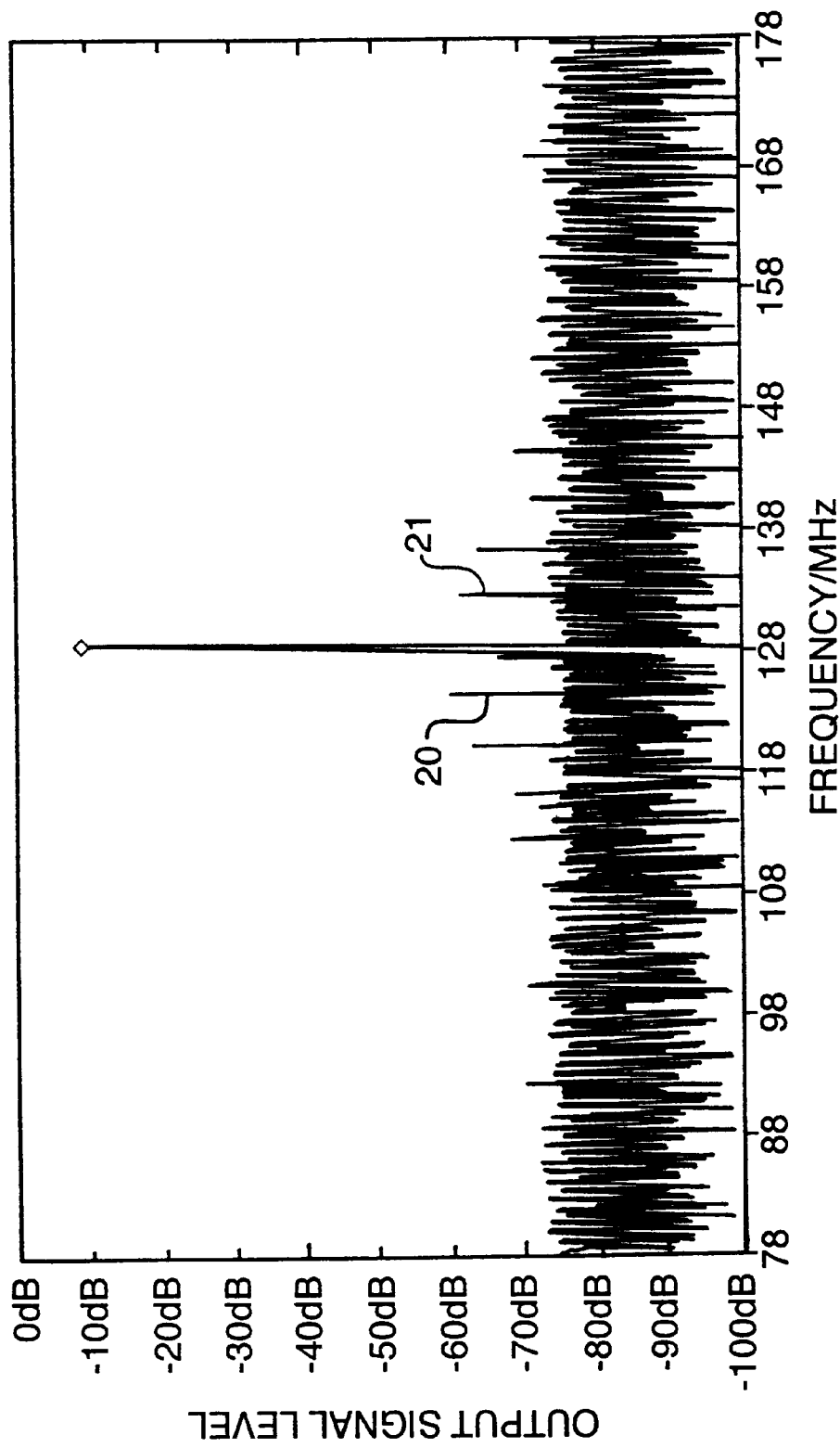
FIG. 3 shows the spectrum of an output signal of a frequency synthesizer in accordance with the present invention.

FIG. 3 shows the spectrum of an output signal provided by a frequency synthesizer in accordance with the present invention. The same SP2002 DDFS chip, controlled to provide in phase and quadrature sinewave signals at a frequency of 63.75 MHz from a 1024 MHz clock signal, was connected with a Watkins-Johnson SM4A-1 micromixer circuit on its output terminals, in the manner shown in FIG. 1. It can be seen from FIG. 3 that the output signal obtained has greatly reduced spurious signal levels 20, 21, the largest 20 being at −54 dBc. An improvement of 19 dB was thus achieved, the only cost being a slightly raised noise floor.

Figure 4:
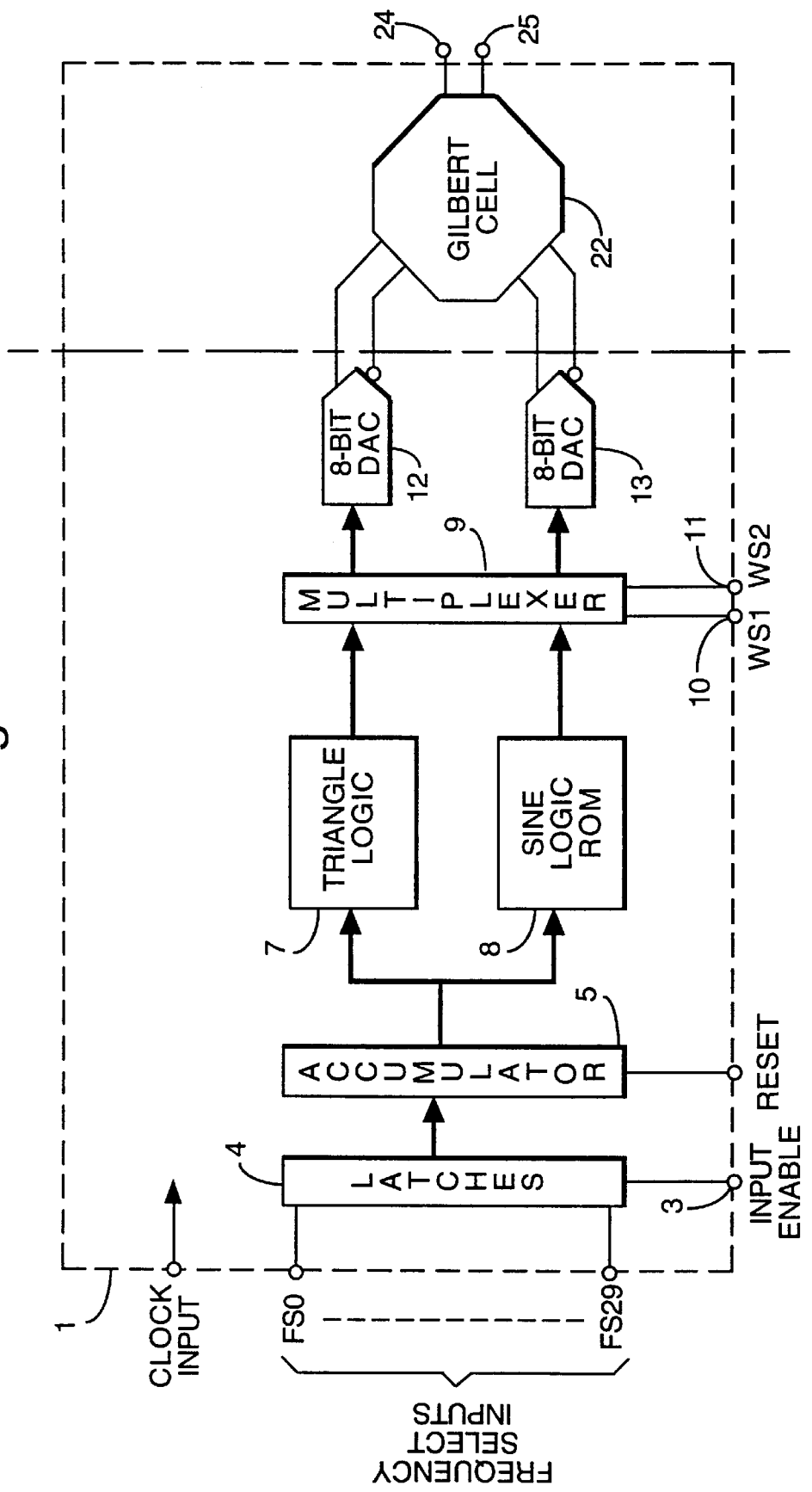
FIG. 4 shows, in block diagram form, a second embodiment of a frequency synthesiser in accordance with the present invention.

FIG. 4 shows, in block diagram form, a second embodiment of a frequency synthesiser in accordance with the present invention. Components which are the same as those shown in FIG. 1 have kept the same reference numerals. In this embodiment, a Gilbert cell circuit 22 is fabricated on the same chip as DDFS 1, between the outputs of DACs 12 and 13 and chip output terminals 24 and 25. The balanced mixer is implemented as a Gilbert cell circuit 22 because it is more suited to monolithic production than are micromixer circuits.

This embodiment allows mass production of frequency synthesizers in accordance with the present invention at a lower cost than the FIG. 1 embodiment.

I claim:

1. A frequency synthesizer, comprising:
    a direct digital frequency synthesizer having a frequency select input and first and second outputs, and operable to generate, at the first and second outputs, signals of the same frequency as each other and in a quadrature phase relationship to each other; and
    a balanced mixer having first and second inputs and an output, the first and second outputs of the direct digital frequency synthesizer being connected to respective ones of the first and second inputs of the balanced mixer, the balanced mixer being operable to provide, at the output of the balanced mixer, an output signal having a frequency twice the frequency of the signals generated at the first and the second outputs of the direct digital frequency synthesizer.

2. The frequency synthesizer in accordance with claim 1, in which the balanced mixer and the direct digital frequency synthesizer are fabricated as a single integrated circuit.

3. The frequency synthesizer in accordance with claim 1, in which the direct digital frequency synthesizer is operable to provide sinewave in-phase and quadrature output signals, thereby providing a sinewave signal at said frequency from the balanced mixer.

4. The frequency synthesizer in accordance with claim 1, in which the balanced mixer is a Gilbert cell circuit which, in use, operates in a linear region.

5. The frequency synthesizer in accordance with claim 1, in which the balanced mixer is a micromixer circuit which, in use, operates in a linear region.

* * * * *